(12) United States Patent
Harley et al.

(10) Patent No.: US 9,911,874 B2
(45) Date of Patent: Mar. 6, 2018

(54) ALIGNMENT FREE SOLAR CELL METALLIZATION

(71) Applicant: SUNPOWER CORPORATION, San Jose, CA (US)

(72) Inventors: Gabriel Harley, Mountain View, CA (US); Taeseok Kim, San Jose, CA (US); Benjamin Ian Hsia, Fremont, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/292,280

(22) Filed: May 30, 2014

(65) Prior Publication Data

US 2015/0349154 A1 Dec. 3, 2015

(51) Int. Cl.
*H01L 31/0224* (2006.01)
*H01L 31/18* (2006.01)

(52) U.S. Cl.
CPC ........... *H01L 31/022433* (2013.01); *H01L 31/022425* (2013.01); *H01L 31/022441* (2013.01); *H01L 31/18* (2013.01); *Y02E 10/50* (2013.01)

(58) Field of Classification Search
CPC .................. H01L 31/18; H01L 31/022433
See application file for complete search history.

(56) References Cited

U.S. PATENT DOCUMENTS

| | | | | |
|---|---|---|---|---|
| 3,647,544 A | * | 3/1972 | Schneider | H01M 4/0442 429/210 |
| 4,469,929 A | * | 9/1984 | Rosen | H01L 31/18 219/121.64 |
| 2008/0216887 A1 | | 9/2008 | Hacke et al. | |
| 2008/0299297 A1 | | 12/2008 | Cousins et al. | |
| 2010/0051085 A1 | | 3/2010 | Weidman et al. | |
| 2010/0055822 A1 | * | 3/2010 | Weidman et al. | 438/57 |
| 2010/0084009 A1 | * | 4/2010 | Carlson et al. | 136/255 |
| 2010/0243049 A1 | | 9/2010 | Leidholm et al. | |
| 2011/0041890 A1 | * | 2/2011 | Sheats | H01L 31/022433 136/244 |
| 2012/0204938 A1 | | 8/2012 | Hacke et al. | |
| 2012/0247560 A1 | * | 10/2012 | Rim | H01L 21/02381 136/261 |
| 2013/0087192 A1 | * | 4/2013 | Kim et al. | 136/256 |
| 2013/0312810 A1 | * | 11/2013 | Hamaguchi | H01L 31/022425 136/244 |
| 2014/0020756 A1 | * | 1/2014 | Goto | H01L 31/022441 136/256 |
| 2014/0106551 A1 | | 4/2014 | Srinivasan et al. | |
| 2014/0360567 A1 | * | 12/2014 | Seutter | H01B 1/023 136/256 |
| 2015/0090329 A1 | * | 4/2015 | Pass | H01L 31/022441 136/256 |

OTHER PUBLICATIONS

Search Report and Written Opinion for International Application No. PCT/US2015/032318, dated Sep. 3, 2015, 17 pages.
International Preliminary Report on Patentability for PCT Patent Application No. PCT/US15/032318, dated Dec. 15, 2016, 10 pgs.

* cited by examiner

*Primary Examiner* — Bethany L Martin
(74) *Attorney, Agent, or Firm* — Schwabe, Williamson & Wyatt, P.C.

(57) ABSTRACT

A solar cell can include a substrate and a semiconductor region disposed in or above the substrate. The solar cell can also include a contact finger coupled to the semiconductor region via a plurality of weld regions with at least one of the weld regions being a partial weld.

16 Claims, 15 Drawing Sheets

ALIGNMENT FREE SOLAR CELL METALLIZATION

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
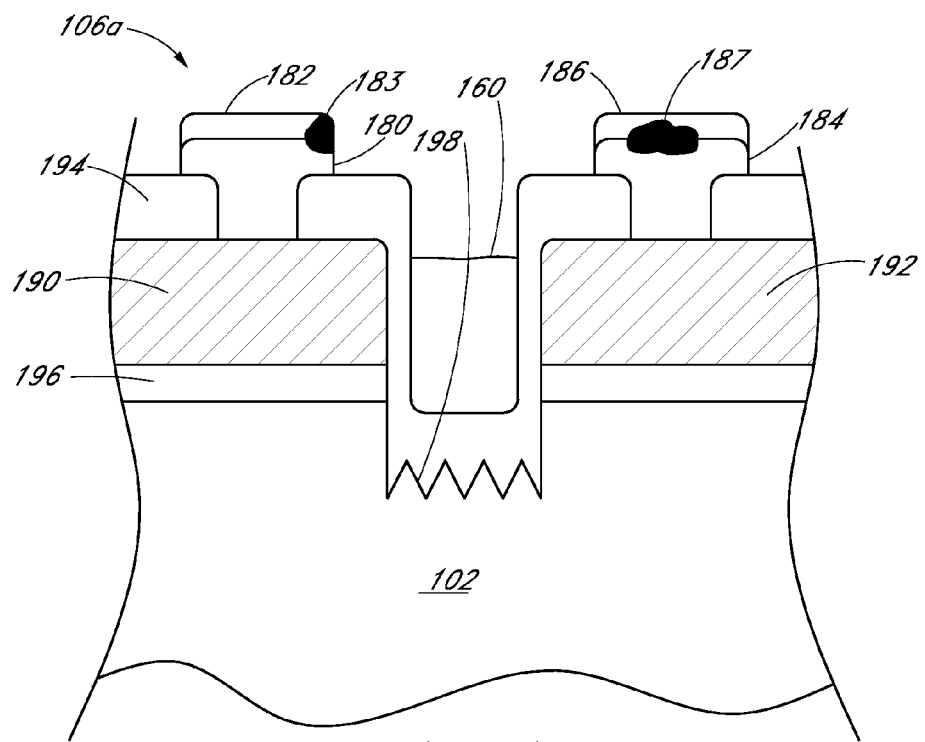
FIG. 1 illustrates a cross-sectional view of a portion of an example solar cell having conductive contacts formed on emitter regions formed above a substrate, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" weld region of a solar cell does not necessarily imply that this weld region is the first weld region in a sequence; instead the term "first" is used to differentiate this weld region from another weld region (e.g., a "second" weld region).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

A much of the disclosure is described in terms of solar cells for ease of understanding, the disclosed techniques and structures apply equally to other semiconductor structures (e.g., silicon wafers generally).

Solar cell conductive contacts and methods of forming solar cell conductive contacts are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography techniques, are not described in detail in order to not unnecessarily obscure embodiments of the present disclosure. Furthermore, it is to be understood that the various embodiments shown in the figures are illustrative representations and are not necessarily drawn to scale.

This specification first describes example solar cells (e.g., for one sun or concentrated PV applications) that can include the disclosed conductive contacts having a random array of welds, followed by description of example methods for forming the disclosed conductive contacts having a random array of welds. Various examples are provided throughout. Although the specification focuses on solar cells for clarity of explanation, the disclosed structures and/or techniques can apply equally to light emitting diodes (LEDs) as well.

In a first example solar cell, a conductive foil is used to fabricate contacts, such as back-side contacts, for a solar cell having emitter regions formed above a substrate of the solar cell. For example, FIG. 1 illustrates a cross-sectional view of a portion of a solar cell having conductive contacts formed on emitter regions formed above a substrate, in accordance with an embodiment of the present disclosure.

Referring to FIG. 1, a portion of solar cell 106a includes patterned dielectric 194 disposed above an n-type doped polysilicon region 190, a p-type doped polysilicon region 192, and on portions of substrate 102 exposed by trench 198. Conductive contacts are disposed in a plurality of contact openings disposed in dielectric 194 and are coupled to the n-type doped polysilicon region 190 and to the p-type doped polysilicon region 192.

In one embodiment, n-type doped polysilicon region 190 and p-type doped polysilicon region 192 can provide emitter regions for solar cell 106A. Thus, in an embodiment, conductive contacts are disposed on the emitter regions. In an embodiment, conductive contacts are back contacts for a back-contact solar cell and are situated on a surface of the solar cell opposing a light receiving surface of solar cell 106A. Furthermore, in one embodiment, the emitter regions are formed on a thin or tunnel dielectric layer 196.

In some embodiments, as shown in FIG. 1, fabricating a back-contact solar cell can include forming thin dielectric layer 196 on substrate 102. In one embodiment, a thin dielectric layer is composed of silicon dioxide and has a thickness approximately in the range of 5-50 Angstroms. In one embodiment, thin dielectric layer performs as a tunnel oxide layer. In an embodiment, the substrate is a bulk monocrystalline silicon substrate, such as an n-type doped monocrystalline silicon substrate. However, in another embodiment, the substrate includes a polycrystalline silicon layer disposed on a global solar cell substrate.

Trench 198 can be formed between n-type doped polysilicon (or amorphous silicon) region 190 and p-type doped polysilicon region 192. Portions of trench 198 can be texturized to have textured features. Dielectric 194 can be formed above the n-type and p-type doped polysilicon regions and above the portions of substrate exposed by trenches. In one embodiment, a lower surface of dielectric 194 can be formed conformal with the n-type and p-type doped polysilicon regions and the exposed portions of substrate 102. In one embodiment, an upper surface of dielectric 194 can be substantially flat. In a specific embodiment, dielectric 194 is an anti-reflective coating (ARC) layer.

A plurality of contact openings can be formed in dielectric 194. The plurality of contact openings can provide exposure to the n-type and p-type doped polysilicon regions, such as n-type doped region 190 and p-type doped region 192. In various embodiments, the contact openings can be formed by laser ablation, chemical etch, mechanical techniques, or lithography. In one embodiment, the contact openings to the n-type doped polysilicon regions have substantially the same height as the contact openings to the p-type doped polysilicon regions.

Forming contacts for the back-contact solar cell can include forming conductive contacts in the plurality of contact openings and coupled to n-type doped polysilicon region 190 or p-type doped polysilicon region 192, respectively. Thus, in an embodiment, conductive contacts are formed on or above a surface of a bulk N-type silicon substrate opposing a light receiving surface bulk N-type silicon substrate. In a specific embodiment, the conductive contacts are formed on regions (190/192) above the surface of substrate 102.

Still referring to FIG. 1, conductive contacts can include conductive foil, such as conductive foil 182 or 186. In various embodiments, conductive foil can include aluminum, copper, tin, other conductive materials, and/or a combination thereof. In some embodiments, as shown in FIG. 1, conductive contacts can also include one or more conductive (metal or otherwise) regions, such as regions 180 and 184 in FIG. 1, between conductive foil 182 or 186 and a respective semiconductor region. For example, a first conductive region 180 or 184 can include (e.g., aluminum, aluminum/silicon alloy, etc.), which can be printed (e.g., in a predetermined pattern, such as an interdigitated finger pattern), or blanket deposited (e.g., sputtered, evaporated, etc.), which can in some embodiments then be later patterned along with the conductive foil.

In some embodiments (not illustrated), a second conductive region can also be used in a conductive contact, which can be an intermetallic or thin blanket interlayer, which can reduce the power required to weld the foil to the conductive regions. Example second conductive regions can include tantalum and/or tin, or other materials. In various embodiments, the second conductive region can be deposited on the first conductive region or to the foil before the cell and foil are brought into contact.

In some embodiments, conductive foil 182 and 186 can be aluminum (Al) foil, whether as pure Al or as an alloy (e.g., Al/Silicon (Al/Si) alloy foil), tin, copper, alloys of tin and/or copper, or other conductive materials or alloys. Although much of the disclosure describes metal foil and metal conductive regions, note that in some embodiments, non-metal conductive foil (e.g., conductive carbon) and non-metal conductive regions can similarly be used in addition to or instead of metal foil and metal conductive regions. As described herein, metal foil can include Al, Al—Si alloy, tin, copper, and/or silver, among other examples. In some embodiments, conductive foil can be less than 5 microns thick (e.g., less than 1 micron), while in other embodiments, the foil can be other thicknesses (e.g., 15 microns, 25 microns, 37 microns, etc.) In some embodiments, the type of foil (e.g., aluminum, copper, tin, etc.) can influence the thickness of foil needed to achieve sufficient current transport across the solar cell. Moreover, in embodiments having one or more conductive regions between the foil and the semiconductor material, the foil can be thinner than in embodiments not having those conductive regions.

In various embodiments, conductive regions 180 and 184 can be formed from a metal paste (e.g., a paste that includes the metal particles as well as a binder such that the paste is printable), from a metal powder (e.g., metal particles without a binder, a powder of Al particles, a layer of Al particles and a layer of Cu particles), or from a combination of metal paste and metal powder. In one embodiment using metal paste, paste may be applied by printing (e.g., screen printing, ink-jet printing, etc.) paste on the substrate. The paste may include a solvent for ease of delivery of the paste and may also include other elements, such as binders or glass frit. In various embodiments, the conductive regions can be blanket deposited and then later patterned along with the conductive foil whereas in other embodiments, the conductive regions can be formed in a particular pattern, such as a finger pattern for the solar cell. Examples of blanket deposited and pre-patterned conductive regions are described herein In various embodiments, the metal particles of conductive regions 180 and 184 can have a thickness of approximately 1-500 microns. For example, for an embodiment in which the metal particles are printed, the printed metal particles can have a thickness of approximately 1-10 microns.

In various embodiments, the metal particles can be fired (before and/or after the conductive foil is formed over the conductive region(s)), also referred to as sintering, to coalesce the metal particles together, which can enhance conductivity and reduce line resistance thereby improving the performance of the solar cell.

Although much of the description describes using conductive foil instead of plated metal, in some embodiments, additional metal can be plated to conductive foil 182 and 186. For example, nickel and/or copper can be plated according to an electroless or electrolytic plating technique. Note that in one embodiment, zinc may be added, for example in a Zincate process, to enable plating on aluminum.

Figure 9:
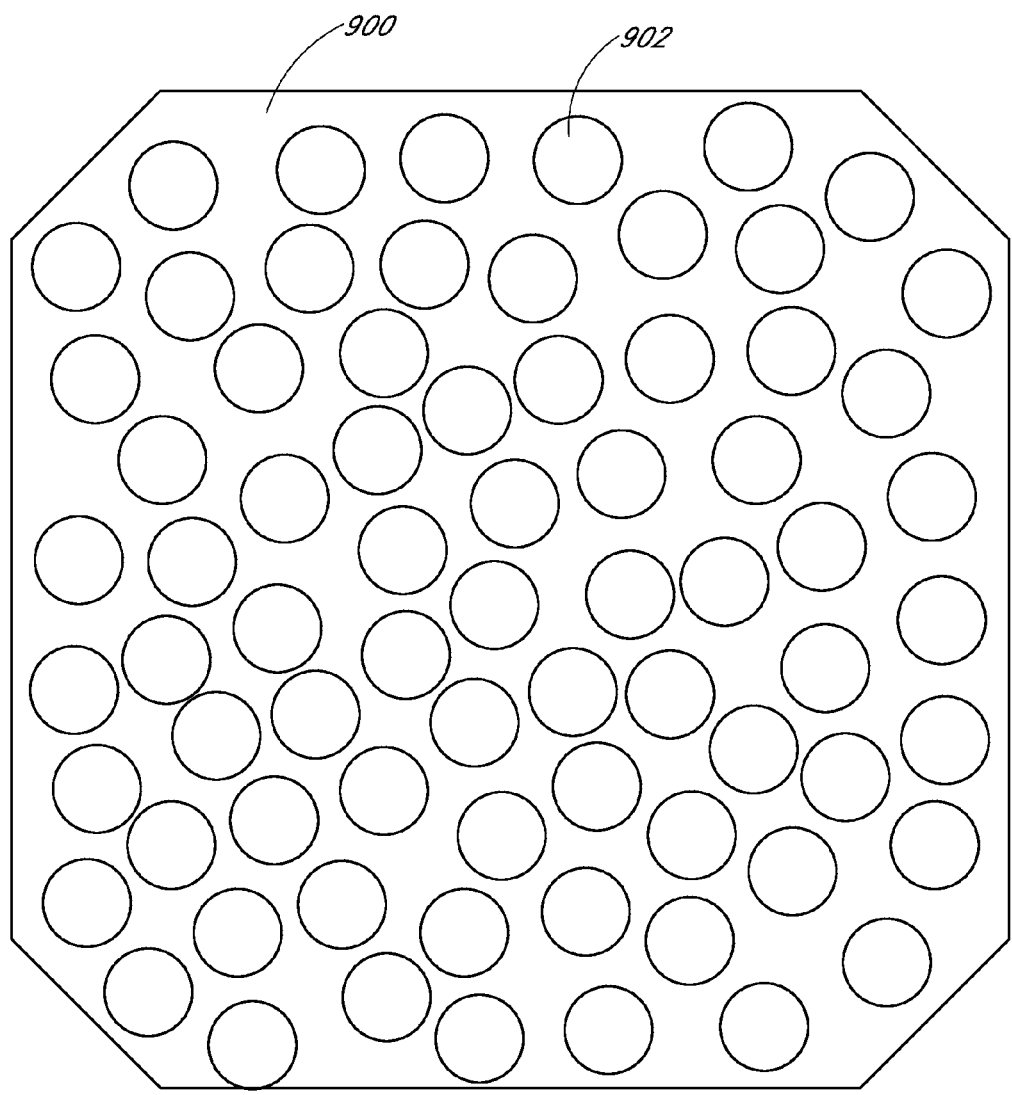
FIGS. 9 and 10 illustrate top-down views of a backside of an example solar cell before and after patterning, respectively, according to various embodiments.
Figure 10:
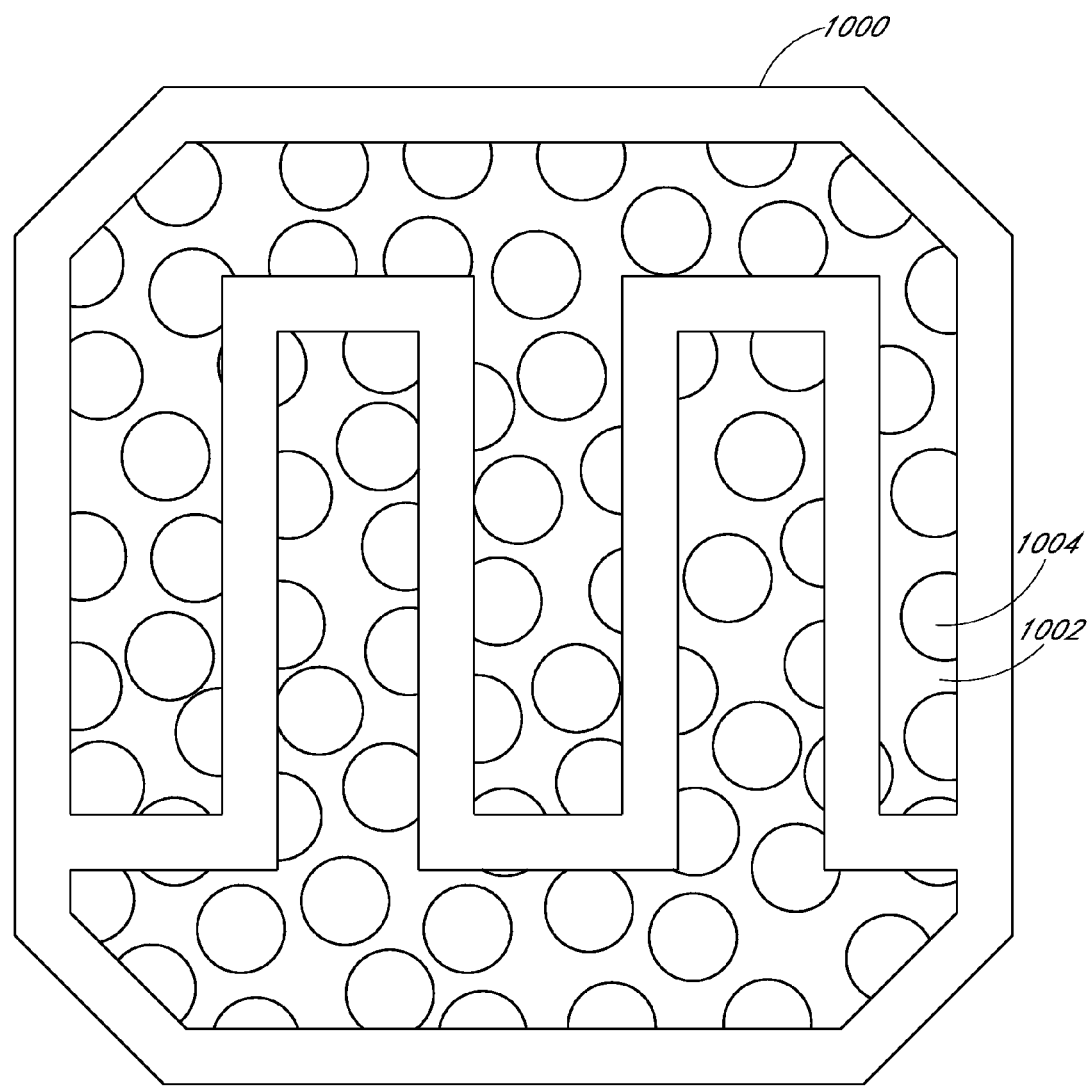
Figure 11:
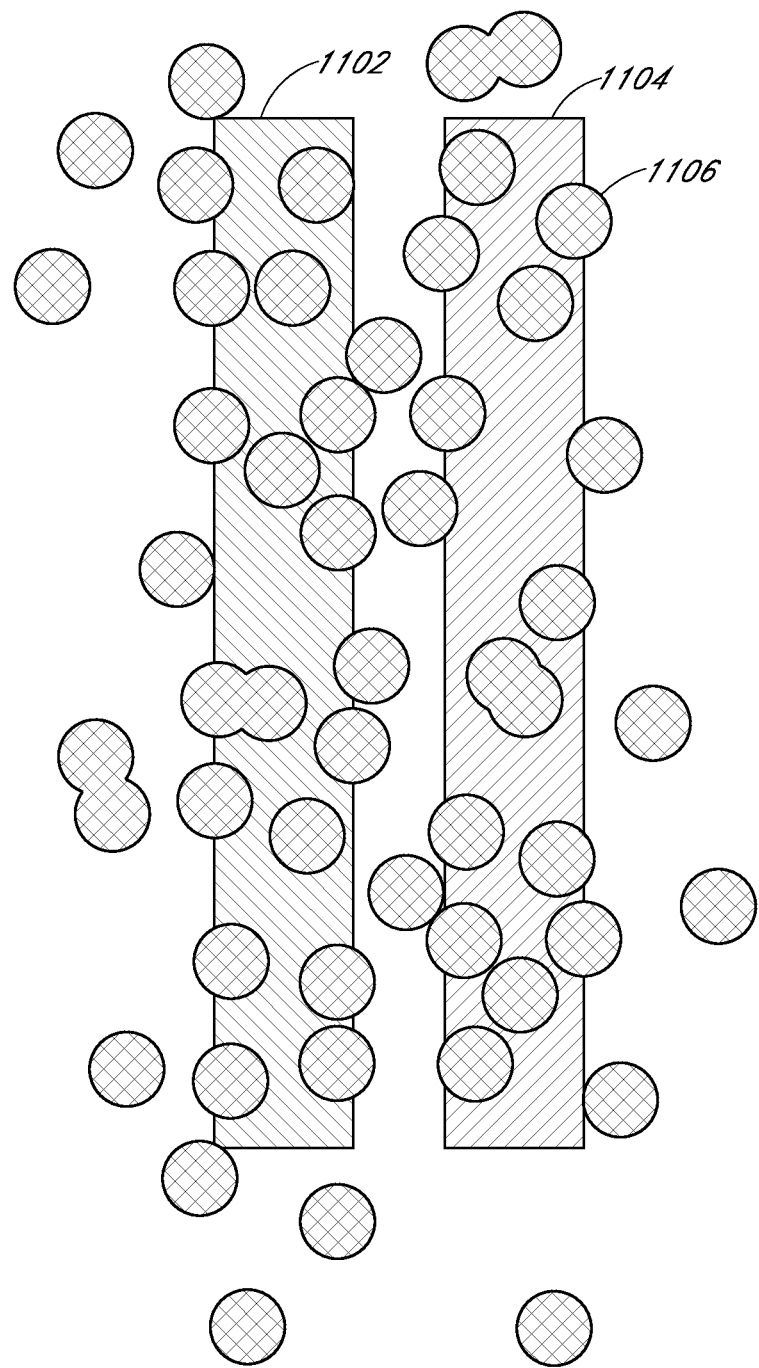
FIG. 11 illustrates a top-down view of example contact fingers of a solar cell, according to various embodiments.

In various embodiments, the resulting patterned conductive foil and/or conductive region can be referred to collectively as a contact finger. In one embodiment, conductive foil can be coupled to conductive region and/or the semiconductor region via weld regions 183 and 187. The weld regions can be applied according to the disclosed techniques resulting in a high-density random array of welds. Random array is used herein to describe a weld patterned that is not tightly aligned. For example, the weld spots can include at least one partial weld, such as weld 183 in FIG. 1 and can also include a complete weld, such as weld 187. As another example, the weld regions can be asymmetrically arranged on a contact finger as illustrated in FIGS. 9-11. As another example, in some embodiments, the weld regions can be of varying sizes (e.g., length, depth, etc.). Various examples are illustrated throughout the figures (e.g., as shown in FIGS. 4C, 4D, 6D, 6E, 9-11, etc.).

In various embodiments, damage buffer 160 (which can also be referred to as a sacrificial region or layer) can be disposed between respective n-type and p-type doped regions of the semiconductor region. As an example, damage buffer 160 can be absorbing or reflecting, which can inhibit damage to trench 198 or substrate 102. For instance, an absorbing damage buffer can be a printed polymer configured to absorb laser energy. The damage buffer can be tacky, sticky, textured, or otherwise configured to provide some amount of adherence to the conductive foil to help hold the foil in place during welding and/or patterning.

In some embodiments, solar cell 106A may not include the one or more additional conductive regions 180 and 184. Instead, the conductive foil can be directly coupled to the semiconductor region of the solar cell.

Similarly, in some embodiments, solar cell 106A may not include damage buffer 160. Various examples of solar cells that do not include damage buffer 160 are described herein.

Figure 2:
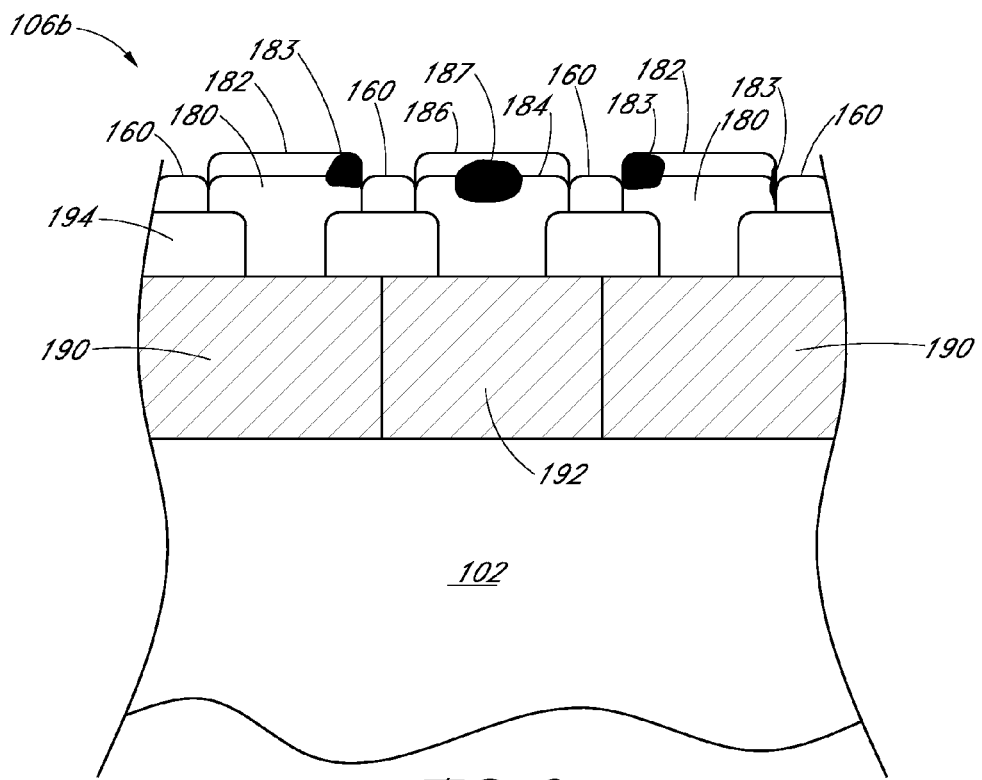
FIG. 2 illustrates a cross-sectional view of a portion of an example solar cell having conductive contacts formed on emitter regions formed in a substrate, according to some embodiments.

Turning now to FIG. 2, a cross-sectional view of a portion of an example solar cell having conductive contacts formed on emitter regions formed in a substrate is illustrated, according to one embodiment. For example, in this second exemplary cell, conductive foil can be used to fabricate contacts, such as back-side contacts, for a solar cell having emitter regions formed in a substrate of the solar cell.

As shown in FIG. 2, a portion of solar cell 106B includes patterned dielectric 194 disposed above a plurality of n-type doped diffusion regions 190, p-type doped diffusion region 192, and on portions of substrate 102, such as a bulk crystalline silicon substrate. Conductive contacts are disposed in a plurality of contact openings disposed in dielectric 194 and are coupled to a respective one of the n-type or p-type doped diffusion regions. In an embodiment, diffusion regions 190 and 192 are formed by doping regions of a silicon substrate with n-type dopants and p-type dopants, respectively. Furthermore, the n-type and p-type doped diffusion regions can, in one embodiment, provide emitter regions for solar cell 106B. Thus, in an embodiment, conductive contacts are disposed on the emitter regions. In an embodiment, conductive contacts are back contacts for a back-contact solar cell and are situated on a surface of the solar cell opposing a light receiving surface, such as opposing a texturized light receiving surface.

In one embodiment, referring again to FIG. 2 and similar to that of FIG. 1, conductive contacts can include a conductive foil 182 or 186 and in some embodiments, one or more additional conductive regions, such as conductive regions 180 or 184. Conductive foil 182 and 186 can be randomly welded to the one or more conductive regions or directly to the semiconductor region of the solar cell and therefore in electrical contact with the emitter regions of the solar cell 106B. The conductive contact description of FIG. 1, including the foil, conductive region(s), and weld description, applies equally to the conductive contact of FIG. 2 but is not repeated for clarity of description.

In some embodiments and similar to the description above in reference to solar cell 106A, solar cell 106B may not include the one or more additional conductive regions 180 and 184. Instead, the conductive foil can directly coupled to the semiconductor region of the solar cell.

Similarly, in some embodiments, solar cell 106B may not include damage buffer 160. Various examples of solar cells that do not include damage buffer 160 are described herein.

Although certain materials are described herein, some materials may be readily substituted with others with other such embodiments remaining within the spirit and scope of embodiments of the present disclosure. For example, in an embodiment, a different material substrate, such as a group III-V material substrate, can be used instead of a silicon substrate.

Note that, in various embodiments, the formed contacts need not be formed directly on a bulk substrate, as was described in FIG. 2. For example, in one embodiment, conductive contacts such as those described above are formed on semiconducting regions formed above (e.g., on a back side of) as bulk substrate, as was described for FIG. 1.

Figure 3:
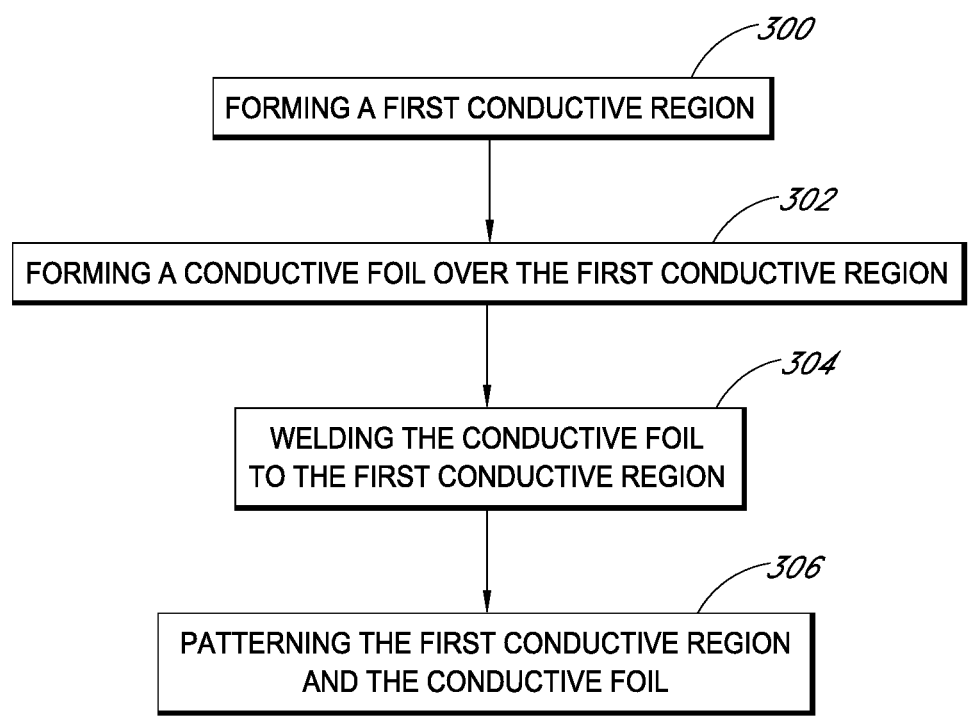
FIG. 3 is a flowchart illustrating an example method of forming a conductive contact having a random array of welds, according to one embodiment.

Turning now to FIG. 3, a flow chart illustrating a method for forming a conductive contact having a random array of welds is shown, according to some embodiments. In various embodiments, the method of FIG. 3 may include additional (or fewer) blocks than illustrated.

Figure 4A:
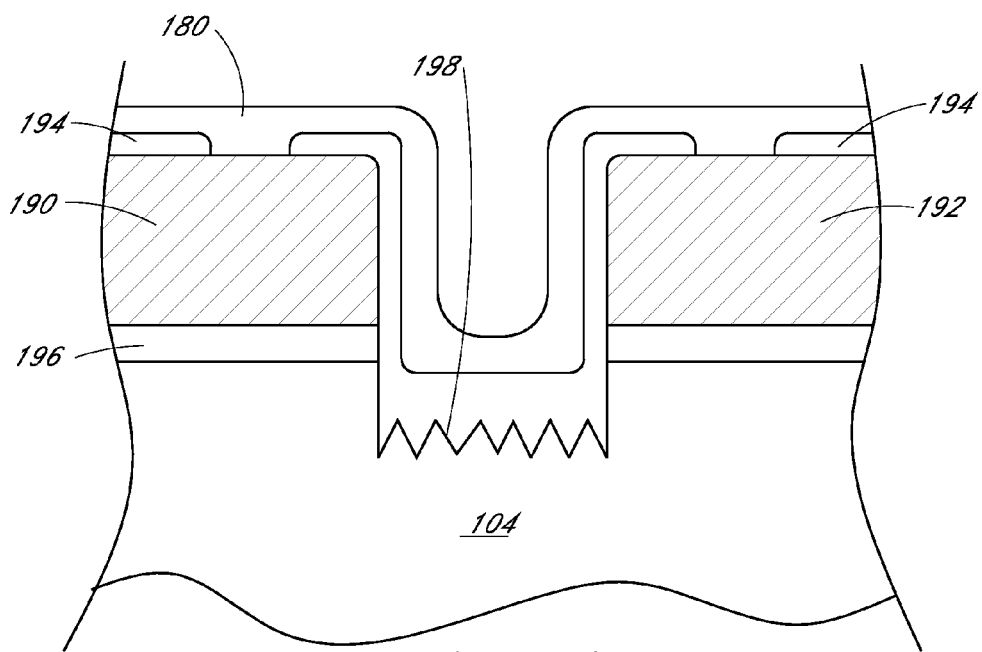
FIGS. 4A-4D illustrate cross-sectional views of forming a conductive contact having a random array of welds according to the method of FIG. 3.

As shown at 300, a first conductive region can be formed over the semiconductor region. For example, in one embodiment, the first conductive region can be formed as a continuous, blanket deposition of metal. Deposition techniques can include sputtered, evaporated, or otherwise blanket deposited conductive material. Example conductive materials for the first conductive region include aluminum, tin, nickel, copper, silver, conductive carbon, alloys of two or more materials, among others. FIG. 4A illustrates a cross-sectional view of block 300 of the method of FIG. 3. As shown, first conductive region 180 is formed over semiconductor regions 190 and 192 as a blanket deposition.

As described herein, in some embodiments, a second conductive region can also be formed, which can reduce the power required to perform the weld at block 304. Example second conductive regions are described herein. In some embodiments, the second conductive region can be used in embodiments in which the first conductive region is printed or otherwise pre-patterned as opposed to blanket deposited.

Figure 4B:
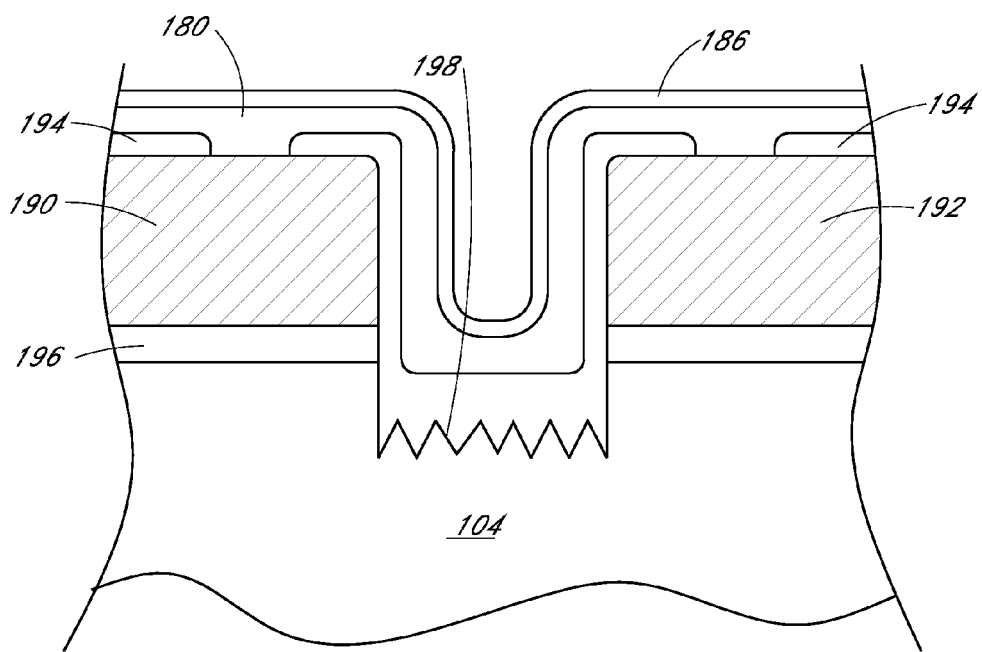

Referring again to FIG. 3, as illustrated at 302, a conductive foil can be formed over the first conductive region (and second conductive region if present). Forming the conductive foil can include a fit-up process (e.g., held down by vacuum or held in position by mechanical force, forced air, using a tacky/sticky damage buffer, etc.) in which the conductive foil is held in sufficient contact for the weld spots to form at block 304 and also to prevent the foil from moving before welded in place. FIG. 4B illustrates a cross-sectional view of block 302 of the method of FIG. 3. As shown, conductive foil 186 is formed over first conductive region 180.

At 304 of FIG. 3, the conductive foil can be welded to the first conductive region (and second conductive region if present). As described herein, in some embodiments, if no conductive region is present between the conductive foil and the semiconductor region, then the conductive foil can be welded directly to the semiconductor region.

In various embodiments, the welding at 304 can be performed such that a laser is applied at random locations of the conductive foil to form welds between the conductive foil and the semiconductor region. Such random application of the laser can be provided by using a high-seed rotating polygon or galvo, which can be applied to a fixed wafer using a mirror, or which can be applied to a wafer moving through the tool.

In one embodiment, the welding at 304 is performed at a higher density to generate more weld spots as compared to a technique that uses precision alignment, rather than random alignment. The higher density can provide sufficient connectivity for the contacts even in situations in which partial welds or misaligned welds occur. Because of the higher density, the random application of the laser can mitigate the risk of heat buildup due to the higher density, as well as series resistance losses due to missing bonds. Additionally, the higher density of weld spots can open up more possibilities for patterning. For example, a higher density can allow an etch-based patterning process to be used without a large risk of etching the first conductive region.

In one embodiment, the welding at 304 is performed at a much higher speed, such as approximately 100 m/s as opposed to a standard laser scanner at 12-15 m/s.

In embodiments in which a blanket first conductive region is applied, welding between the conductive foil and first conductive region can occur anywhere the laser lands. The disclosed techniques, however, can permit such misaligned welds while inhibiting damage to the cell and increasing throughput.

Figure 4C:
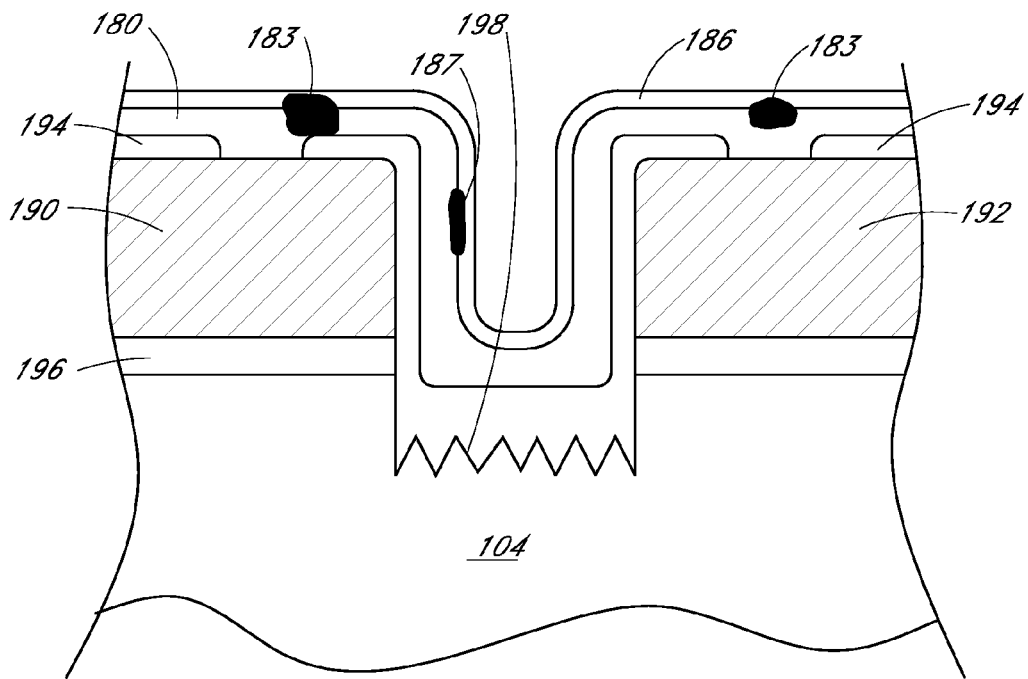

FIG. 4C illustrates a cross-sectional view of block 304 of the method of FIG. 3. As shown, conductive foil 186 is welded to first conductive region 180. Note the asymmetry of weld locations 183 and 187 as well as the length and depth mismatch of the welds that can result from such a high-speed weld process.

Referring again to FIG. 3, the first (and second if present) conductive region and the conductive foil can be patterned as shown at 306. Patterning the foil and conductive region can result in the formation of contact fingers (e.g., interdigitated contact fingers) for the solar cell. The randomness of the laser application can result in partial welds in which a weld overlaps an edge of one of the contact fingers. It can also result in welds of varying lengths, depths, etc. as well as an asymmetric distribution of welds across the solar cell (e.g., as viewed in a top-down view of the backside of the solar cell (as shown in FIGS. 9-11).

Figure 4D:
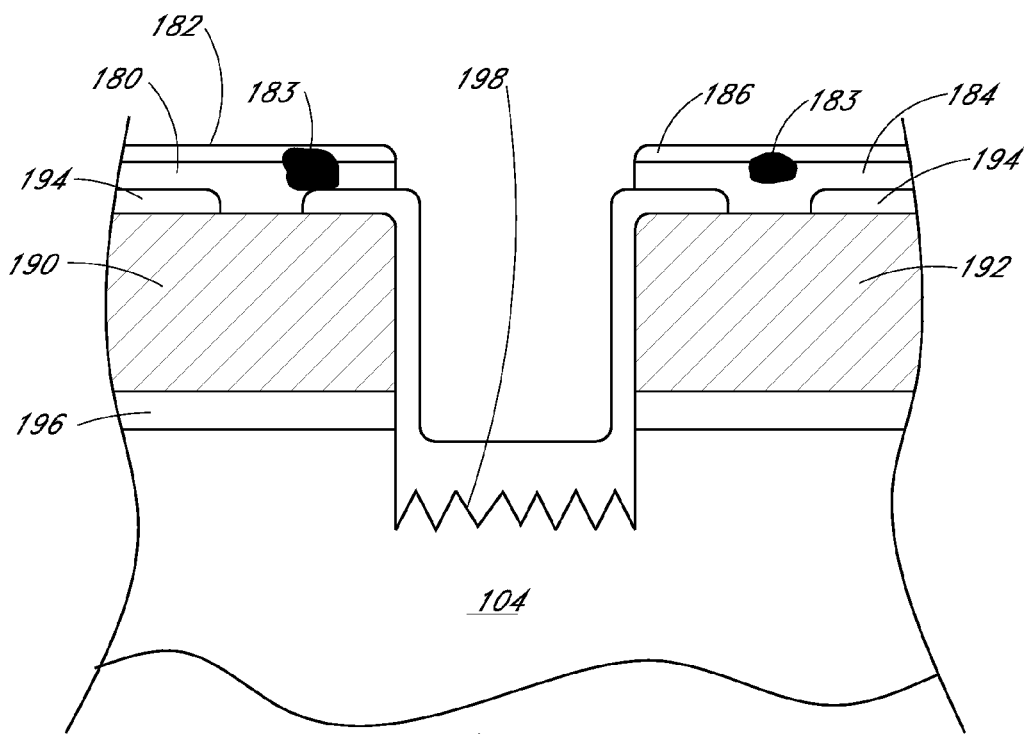

FIG. 4D illustrates a cross-sectional view of block 306 of the method of FIG. 3. As shown, first conductive region 180 and conductive foil 186 can be patterned resulting in separate contact fingers, one n-type finger and one p-type finger.

Because welding can occur anywhere the laser lands in embodiments in which a blanket first conductive region is applied, the patterning process used at 306 can be an isolation step that is impervious to weld. For example, in one embodiment, the patterning technique can be a groove and etch technique. In groove and etch patterning, the conductive foil can be grooved in locations corresponding to locations where separation/isolation between fingers is intended. In one embodiment, laser or mechanical grooving those locations can remove a majority of the thickness in those locations. Accordingly, the groove does not entirely cut through the entire foil, instead leaving a portion. A chemical etch is then applied which removes the remaining portion from the groove thereby separating the foil (and any conductive regions between the foil and semiconductor region) into the finger pattern.

In another embodiment, the patterning technique can be a mask, groove, and etch technique. For example, a non-patterned mask (e.g., non-patterned etch resist, film, PET sheet, etc.) can be applied on the conductive foil, for example, across substantially the entire surface of the conductive foil. The mask can then be patterned, whether by laser ablation, mechanical grooving, or otherwise. In one embodiment, the conductive foil can also be patterned or grooved, for example by laser ablation. Next, a chemical etch is applied and the mask is stripped with the resulting cell having isolated conductive contacts.

In some embodiments, the method of FIG. 3 can also include forming a damage buffer between the conductive foil and the substrate (e.g., between the conductive foil and the first conductive region or between the first conductive region and the substrate) at a region between adjacent p-type and n-type doped regions of the semiconductor region (e.g., as shown in FIGS. 1 and 2). The damage buffer can be a laser absorbing or laser reflecting region in some embodiments. In one embodiment, the damage buffer can be disposed in the trench as illustrated at FIG. 1.

Figure 5:
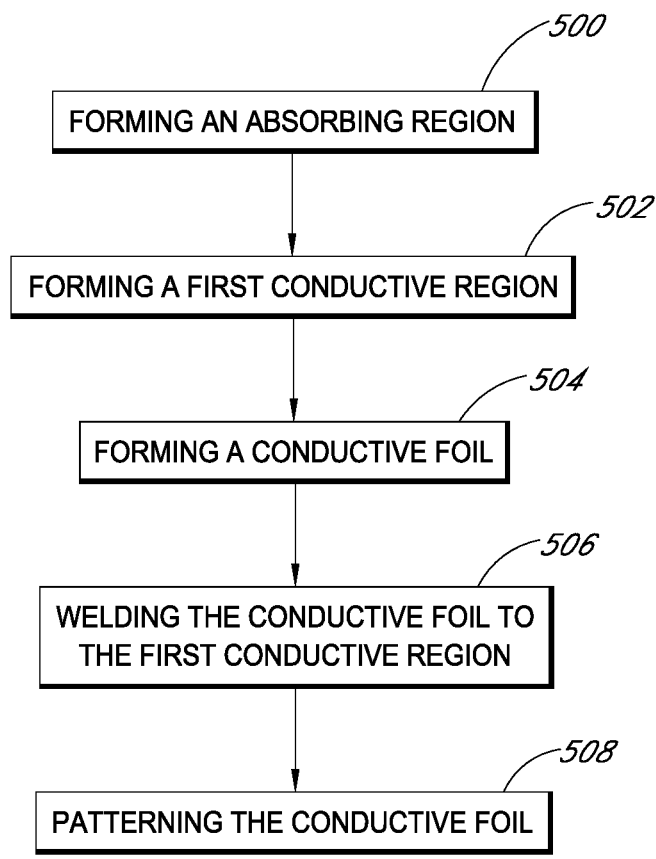
FIG. 5 is a flowchart illustrating an example method of forming a conductive contact having a random array of welds, according to one embodiment.

Turning now to FIG. 5, a flow chart illustrating a method for forming a conductive contact having a random array of welds is shown, according to some embodiments. In various embodiments, the method of FIG. 5 may include additional (or fewer) blocks than illustrated. For example, in one embodiment, forming the first conductive region at block 502 can be omitted and the second conductive region can be welded directly to the doped regions at 506 instead of to the first conductive region. Moreover, in some embodiments, one or more blocks of the method of FIG. 3 can be used in conjunction with the method of FIG. 5.

Figure 6A:
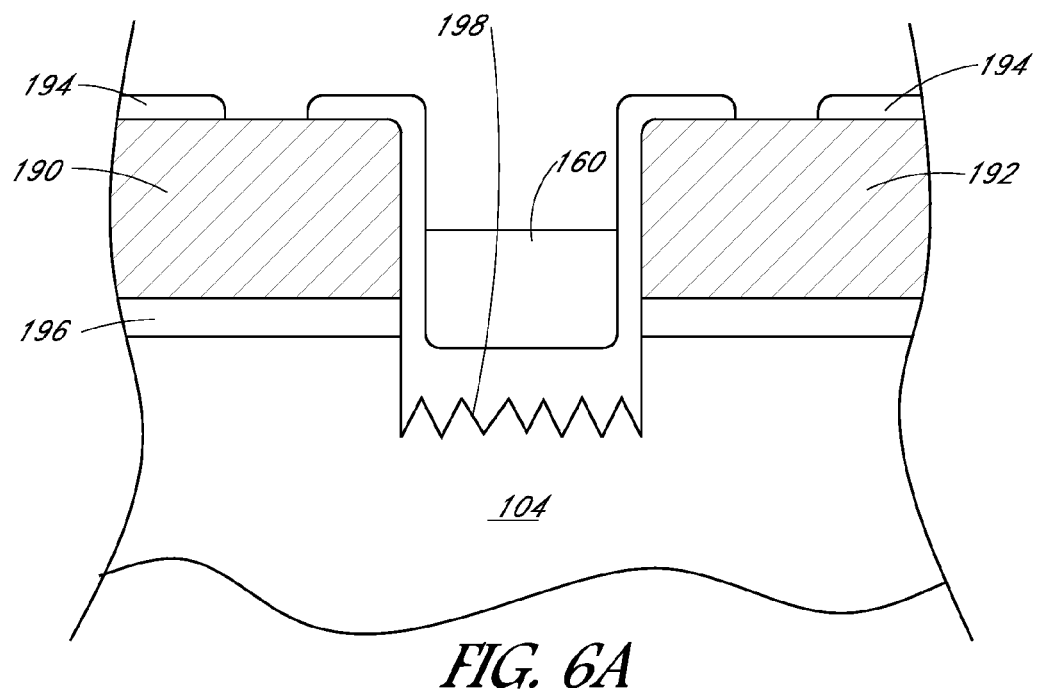
FIGS. 6A-6E illustrate cross-sectional views of forming a conductive contact having a random array of welds according to the method of FIG. 5.

As shown at 500, a damage buffer can be formed as illustrated by the cross-sectional view of FIG. 6A. As shown, damage buffer 160 can be formed in the trench 198 between the n-type and p-type doped regions, 190 and 192. In a solar cell without a trench, for example, the solar cell of FIG. 2, the damage buffer can be formed at a region between adjacent p-type and n-type doped regions of the semiconductor region as shown in FIG. 2. In various embodiments, the damage buffer can be a laser absorbing or laser reflecting region. In one embodiment, the damage buffer can be formed by printing a polymer.

Figure 6B:
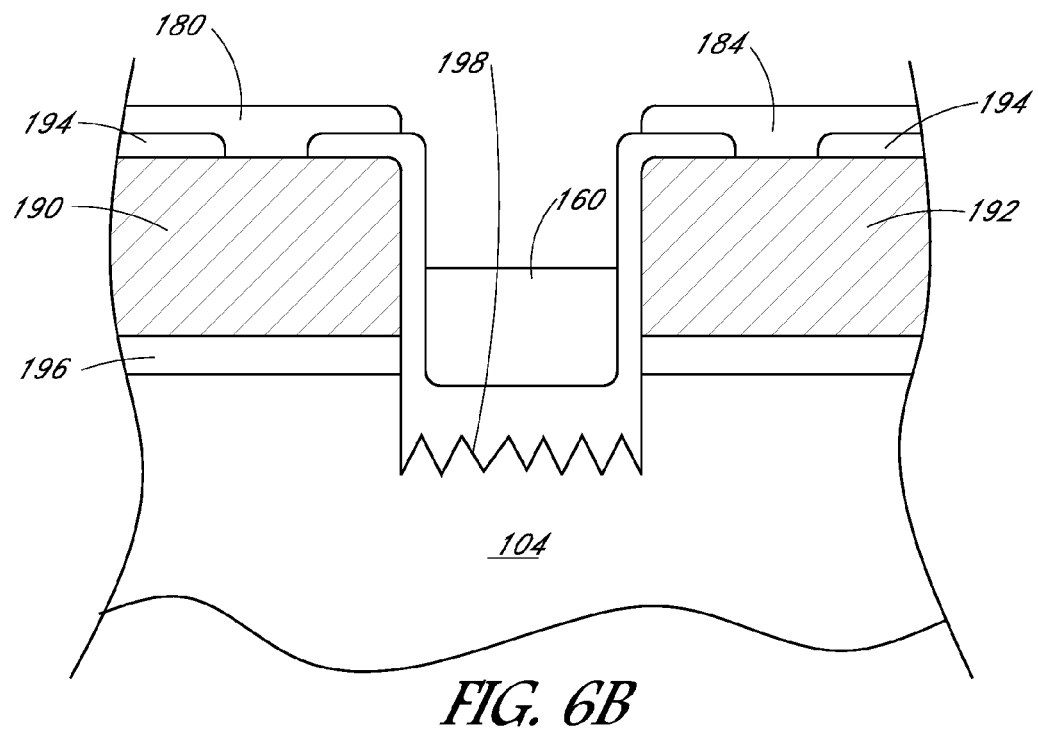

At 502, a first conductive region can be formed as shown in the cross-sectional view of FIG. 6B. As shown the first conductive region is formed as a patterned first conductive region. For example, the first conductive region can be a printed first conductive region, as described herein. In another embodiment, the first conductive region can be applied as a blanket deposition and then patterned.

Figure 6C:
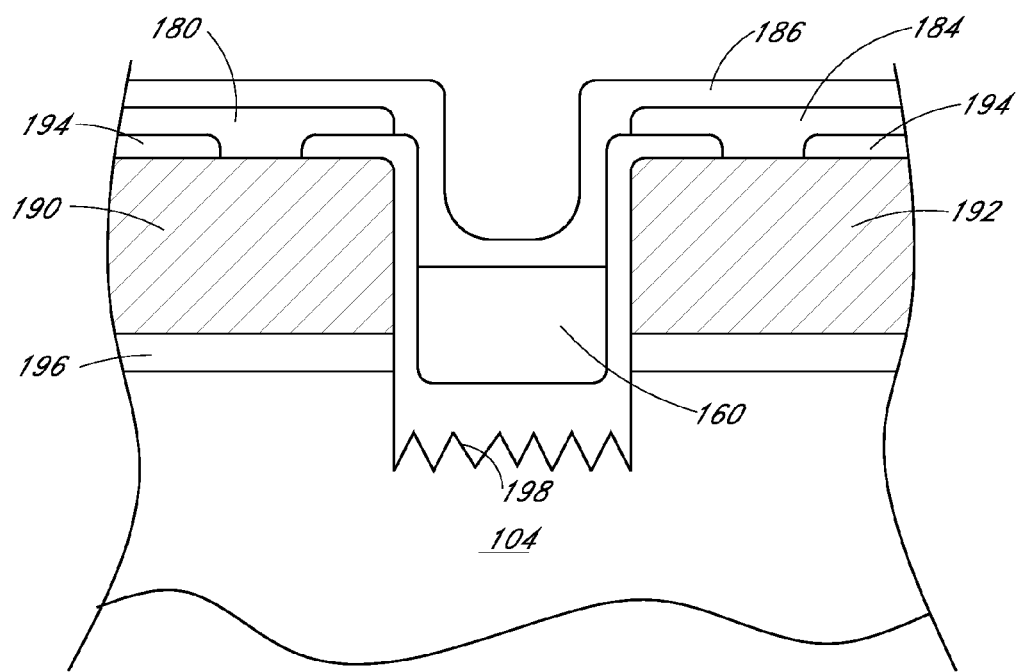

As illustrated at 504 of FIG. 5, a conductive foil can be formed over the first conductive region. The conductive foil can also be formed over the damage buffer and dielectric 194 as shown by conductive foil 186 in the cross-sectional view of FIG. 6C.

Figure 6D:
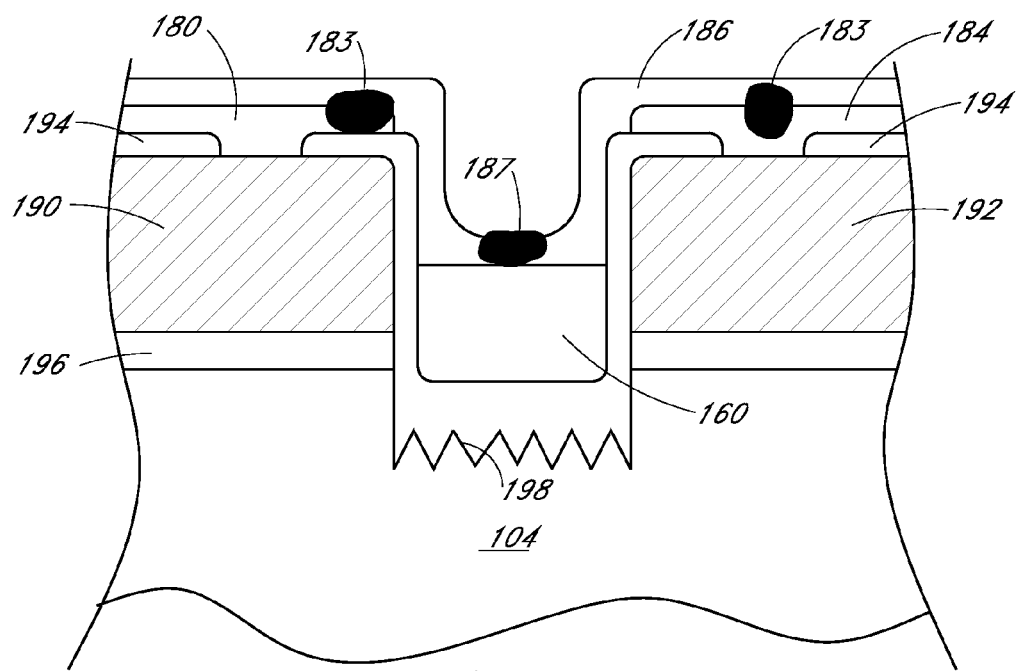

As shown at 506 of FIG. 5, the conductive foil can be welded to the first conductive region as shown by welds 183 and 187 in the cross-sectional view of FIG. 6D. As shown by weld 187, the laser can be applied from above a region that does not have a first conductive region. Without damage buffer 160, the trench and silicon 104 can be damaged by the welding laser thereby harming the efficiency and lifetime of the solar cell. But by using the damage buffer, the laser can be absorbed or reflected such that the silicon is not damaged. Although shown as weld 187, the conductive foil may not necessarily be welded to the damage buffer. Instead, in some embodiments, the conductive foil may just be distorted or melted at weld location 187 but not adhered to the damage buffer.

Figure 6E:
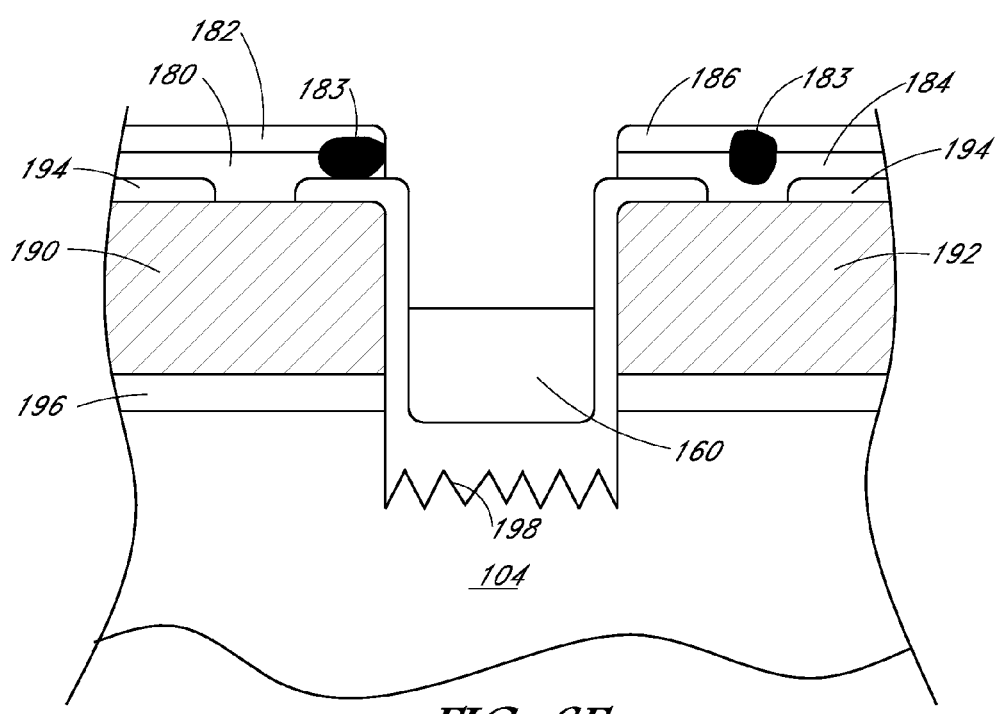

At 508 of FIG. 5, the conductive foil can be patterned. Because the first conductive region is already patterned, a variety of patterning techniques can be used including mask and etch; groove and etch; mask, groove, and etch, among others. FIG. 6E illustrates a cross-sectional view of a portion of a solar cell after the patterning at 508 is performed.

Figure 7:
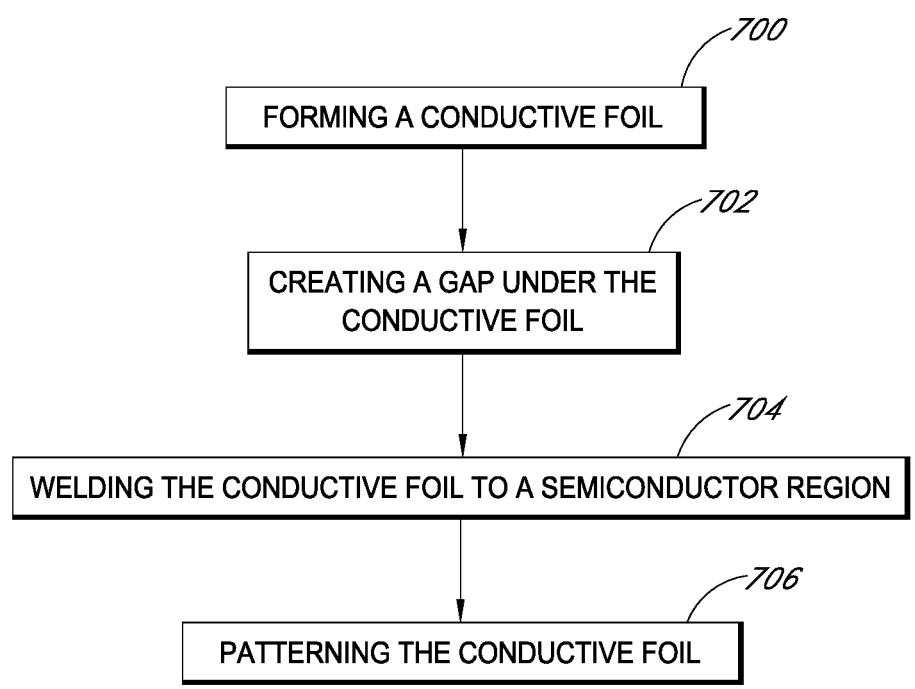
FIG. 7 is a flowchart illustrating an example method of forming a conductive contact having a random array of welds, according to one embodiment.

Turning now to FIG. 7, a flow chart illustrating a method for forming a conductive contact having a random array of welds is shown, according to some embodiments. In various embodiments, the method of FIG. 7 may include additional (or fewer) blocks than illustrated. For example, in one embodiment, a conductive region can be formed before forming the conductive foil at block 700. Moreover, in some embodiments, one or more blocks of the methods of FIGS. 3 and/or 5 can be used in conjunction with the method of FIG. 7.

Figure 8A:
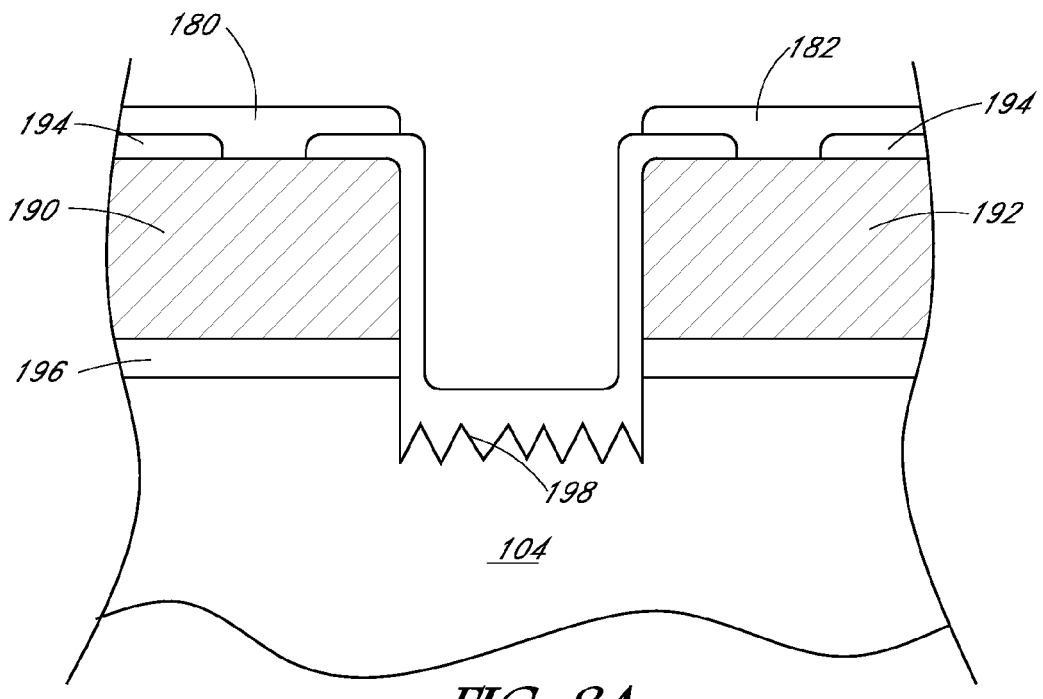
FIGS. 8A-8E illustrate cross-sectional views of forming a conductive contact having a random array of welds according to the method of FIG. 7.
Figure 8B:
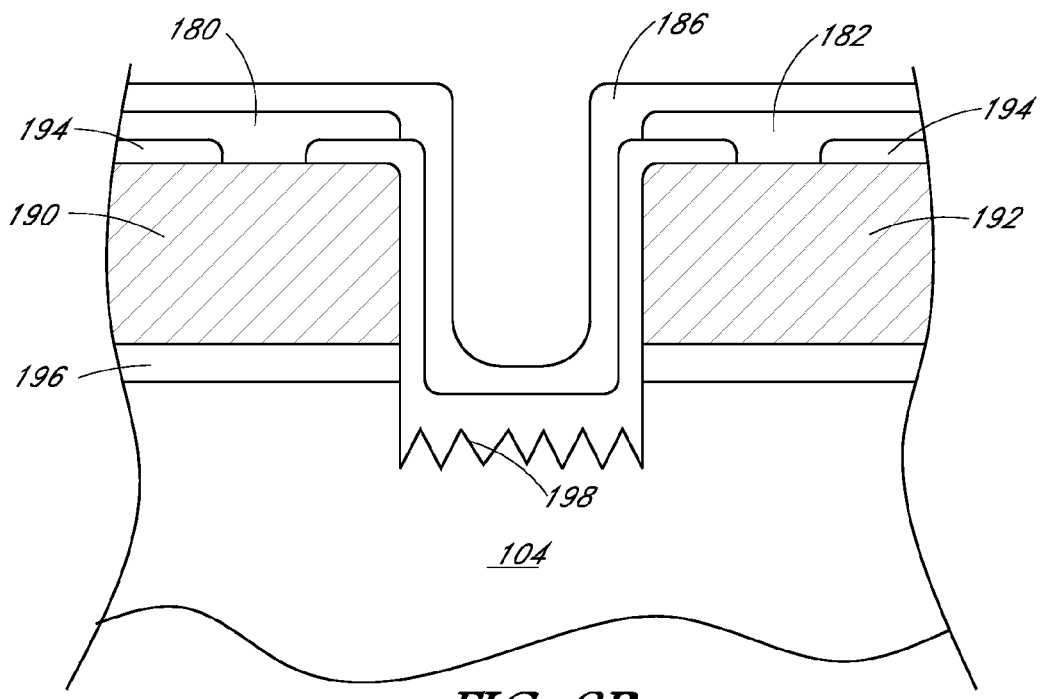

As shown at 700, a conductive foil can be formed over a semiconductor region disposed in or above a substrate. As described herein, the conductive foil can be formed directly on the semiconductor region or one or more conductive regions can be formed between the conductive foil and the semiconductor region. FIG. 8A illustrates a cross-sectional view in which a patterned first conductive region is formed but as mentioned above, in some embodiments, the solar cell may not include a first conductive region. FIG. 8B illustrates a cross-sectional representation of block 700 of FIG. 7. As shown, conductive foil 186 is formed over the semiconductor region (and over the first conductive region).

Figure 8C:
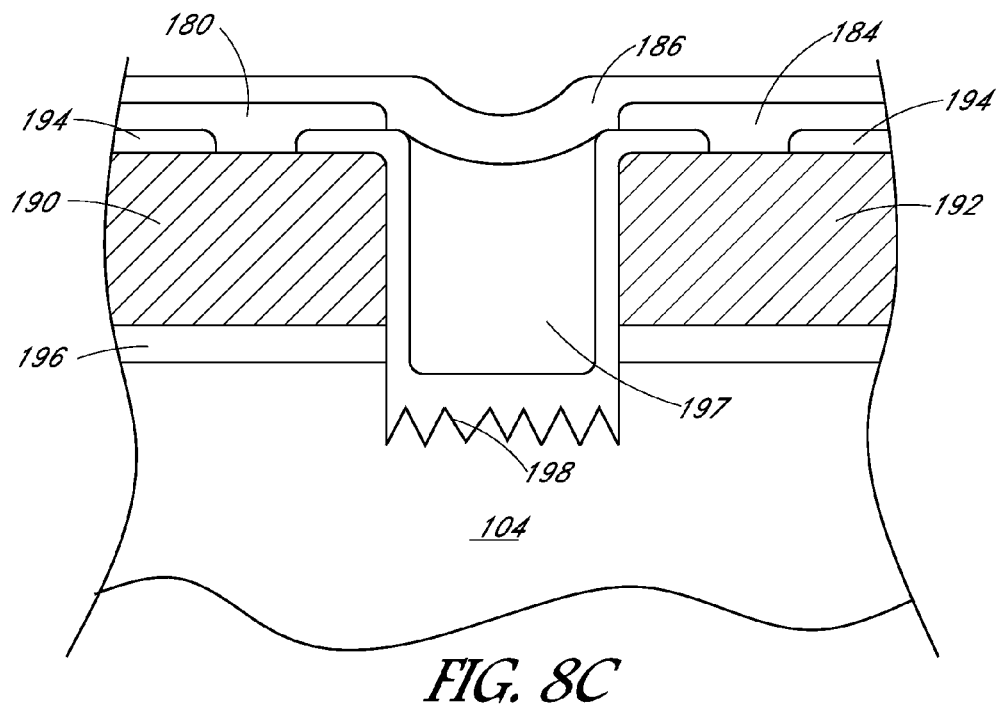

As illustrated at 702 of FIG. 7, a gap can be created under the conductive foil as illustrated by gap 197 in FIG. 8C. The gap can be created according to a variety of techniques. For example, in one embodiment, air can be forced under the foil such that the gap is formed. In another embodiment, the conductive foil can be sucked or pulled away from the surface of the trench. In another embodiment, the foil can be pulled taut prior to welding so as not to be formed in to the depression. As shown, the gap can exist in a location corresponding to the trench but the conductive foil can still remain in contact at other locations (e.g., at locations to be welded at 704).

Figure 8D:
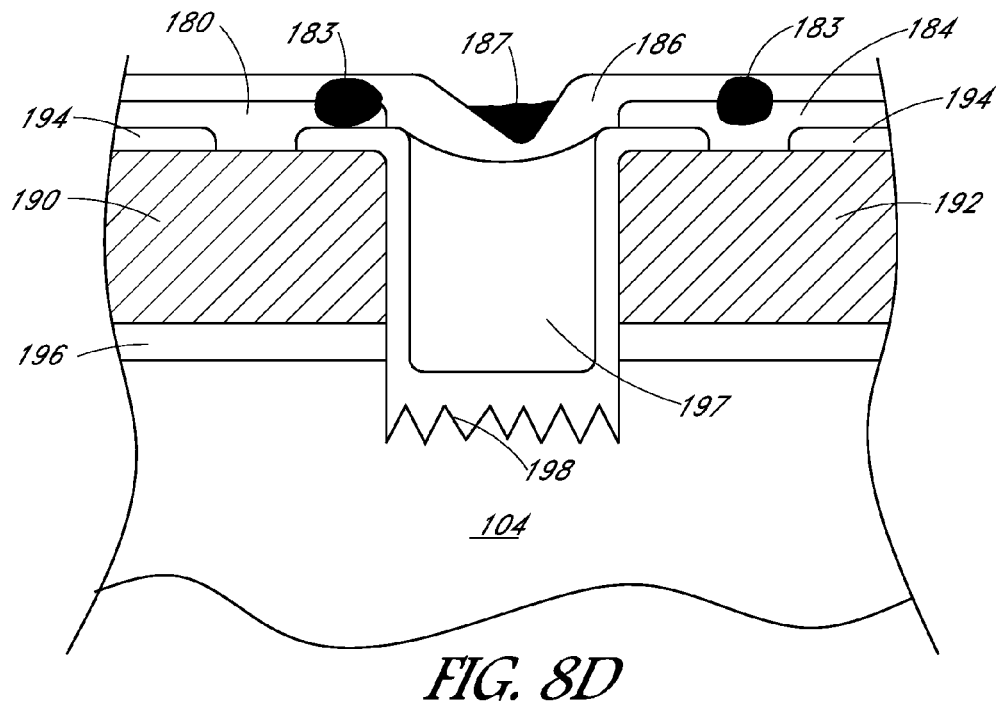

At 704 of FIG. 7, the conductive foil can be welded to the semiconductor region. FIG. 8D illustrates a cross-sectional representation of block 704. As shown at welds 183, the conductive foil is welded to semiconductor regions 190 and 192 via first conductive regions 180 and 184, respectively. As shown, the laser attempted to weld at location 187 but due to the air gap, enough thermal isolation exists such that no weld occurs and damage to the silicon is inhibited.

Figure 8E:
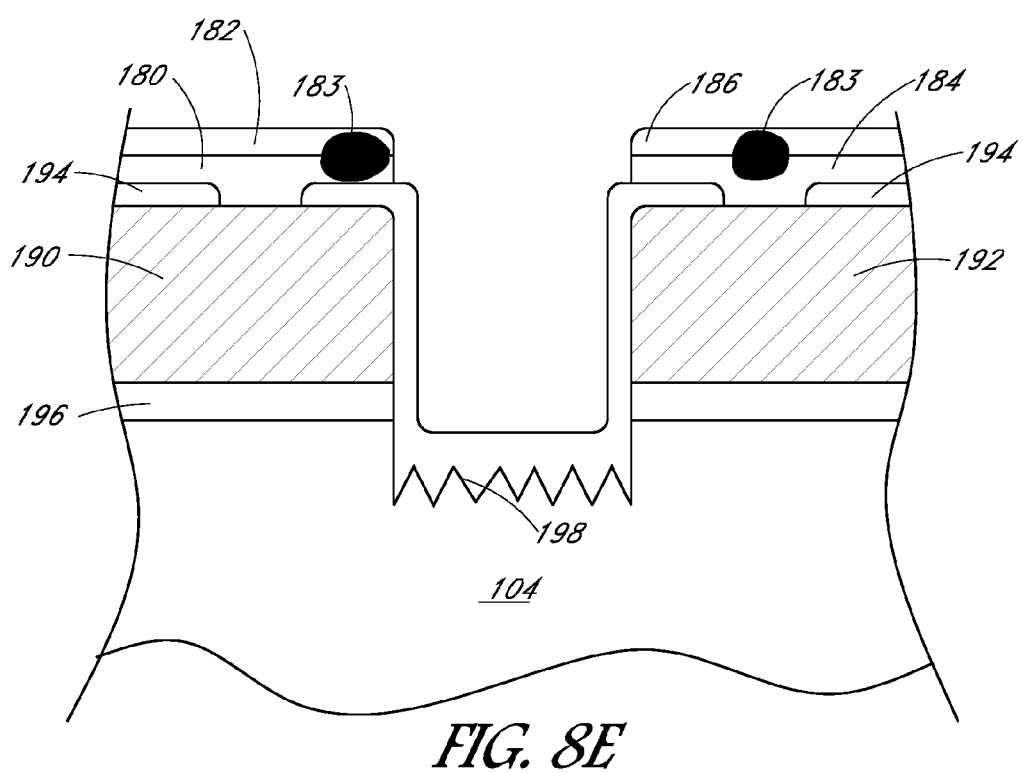

As shown at 706, the conductive foil (and any conductive regions) can be patterned, for example, as described herein. A cross-sectional view of a portion of a solar cell post-patterning at 706 is illustrated in FIG. 8E. Note that after the welds are formed at 704, forcing the air or pulling to form the gap and be released such that a gap is no longer present at the time of patterning at 706.

In various embodiments, such as an embodiment in which no conductive region is present between the conductive foil and semiconductor region, the energy used by the laser can be reduced such that it is suitable for welding but does not damage the cell (e.g., sub ablation fluence of <1 $J/cm^2$). For example, in one embodiment, a longer pulse length could be used such that the heat is sufficient for a weld to be formed. The longer pulse length can provide thermal insulation to prevent heating and heat-affected zone (HAZ) of the silicon. Laser parameters can be controlled in other embodiments as well and other parameters can be adjusted other than power and pulse length, such as the number of pulses.

The various disclosed techniques and structures can offer many advantages. For example, by permitting the laser to weld anywhere over the surface of the conductive foil while at the same time inhibiting damage to the silicon, alignment requirements can be loosened resulting in higher throughput (e.g., the laser scanner can move at approximately 100 m/s instead of 12-15 m/s) and less complex and cheaper tools (e.g., fewer high resolution alignment cameras). Moreover, misaligned weld spots in the disclosed techniques may not result in damage to the silicon (and reduce lifetime and efficiency) or result in increased series resistance.

FIGS. 9 and 10 illustrate top-down views of an example solar cell according to the various disclosed techniques before and after patterning, respectively. As shown in FIG. 9, solar cell 900 includes a random array of welds 902. As shown, the weld spots are asymmetrically arranged over the conductive foil. FIG. 10 illustrates the same weld spots of FIG. 9 on solar cell 1000 after patterning. Patterning results in portions of some weld spots being removed along with portions of the conductive foil between fingers. The result is that some of the weld spots are partial welds, such as partial weld 1004 and partially overlap edges of fingers, as shown by partial weld 1004 at the edge of finger 1002. Not illustrated in FIGS. 9 and 10, some of the weld spots can vary in size (e.g., length, depth) due to the speed at which the laser welding is performed.

FIG. 11 illustrates a top-down view of an example random array of welds on contact fingers of a solar cell, according to various embodiments. Contact finger 1102 illustrates an n-type contact finger and contact finger 1104 illustrates a p-type contact finger. As shown, weld 1106 partially overlaps contact finger 1106 but note that after the patterning process, the edge overlapping contact finger 1106 will be removed as shown in FIG. 10.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A solar cell; comprising:
a substrate;
a semiconductor region disposed in or above the substrate;
a dielectric layer disposed between and laterally adjacent to respective n-type and p-type regions of the semiconductor region, a damage buffer disposed within a trench of the dielectric layer wherein the damage buffer is a laser-absorbing damage buffer, and wherein the entire uppermost surface of the damage buffer is below an uppermost surface of the semiconductor region; and
a contact finger coupled to the semiconductor region via a plurality of weld regions, wherein a first weld region of the plurality of weld regions is a partial weld formed along an outside edge of the contact finger, and wherein the plurality of weld regions includes weld regions having varying lengths.

2. The solar cell of claim 1, wherein the plurality of weld regions are asymmetrically arranged on the contact finger.

3. The solar cell of claim 1, further comprising a first conductive region coupled to and between the contact finger and the semiconductor region.

4. The solar cell of claim 3, further comprising a second conductive region coupled to and between the contact finger and the first conductive region.

5. The solar cell of claim 1, wherein the contact finger comprises a foil that includes aluminum.

6. A solar cell, comprising:
a substrate;
a semiconductor region disposed in or above the substrate;
a dielectric layer disposed between and laterally adjacent to respective n-type and p-type regions of the semiconductor region, a damage buffer disposed within a trench of the dielectric layer wherein the damage buffer is a laser-absorbing damage buffer, and wherein the entire uppermost surface of the damage buffer is below an uppermost surface of the semiconductor region; and
a contact finger coupled to the semiconductor region via a plurality of weld regions, wherein a first weld region of the plurality of weld regions is a partial weld such that the first weld region is formed along an outside edge of the contact finger, and wherein the plurality of weld regions includes weld regions having varying depths.

7. The solar cell of claim 6, wherein the plurality of weld regions are asymmetrically arranged on the contact finger.

8. The solar cell of claim 6, wherein at least one of the plurality of weld regions is a different length than another one of the plurality of weld regions.

9. The solar cell of claim 6, further comprising a first conductive region coupled to and between the contact finger and the semiconductor region.

10. The solar cell of claim 9, further comprising a second conductive region coupled to and between the contact finger and the first conductive region.

11. The solar cell of claim 6, wherein the contact finger comprises a foil that includes aluminum.

12. A solar cell, comprising:
a substrate;
a semiconductor region disposed in or above the substrate;
a dielectric layer disposed between and laterally adjacent to respective n-type and p-type regions of the semiconductor region, a damage buffer disposed within a trench of the dielectric layer wherein the entire uppermost surface of the damage buffer is below an uppermost surface of the semiconductor region; and
a contact finger coupled to the semiconductor region via a plurality of weld regions, wherein a first weld region of the plurality of weld regions is a partial weld formed along an outside edge of the contact finger, and wherein the plurality of weld regions includes weld regions having varying lengths.

13. The solar cell of claim 12, wherein the plurality of weld regions are asymmetrically arranged on the contact finger.

14. The solar cell of claim 12, further comprising a first conductive region coupled to and between the contact finger and the semiconductor region.

15. The solar cell of claim 14, further comprising a second conductive region coupled to and between the contact finger and the first conductive region.

16. The solar cell of claim 12, wherein the contact finger comprises a foil that includes aluminum.

* * * * *